United States Patent
Lee

(10) Patent No.: US 10,643,716 B2
(45) Date of Patent: May 5, 2020

(54) NONVOLATILE MEMORY DEVICE AND MEMORY SYSTEM INCLUDING THE NONVOLATILE MEMORY DEVICE

(71) Applicant: SK hynix Inc., Icheon-si Gyeonggi-do (KR)

(72) Inventor: Sok Kyu Lee, Seongnam-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/208,239

(22) Filed: Dec. 3, 2018

(65) Prior Publication Data

US 2019/0355427 A1 Nov. 21, 2019

(30) Foreign Application Priority Data

May 15, 2018 (KR) .................. 10-2018-0055461

(51) Int. Cl.
| | |
|---|---|
| *G11C 7/00* | (2006.01) |
| *G11C 7/22* | (2006.01) |
| *G11C 16/26* | (2006.01) |
| *G11C 16/08* | (2006.01) |
| *G11C 16/24* | (2006.01) |
| *G11C 7/12* | (2006.01) |

(52) U.S. Cl.
CPC .............. *G11C 16/26* (2013.01); *G11C 16/08* (2013.01); *G11C 16/24* (2013.01); *G11C 7/12* (2013.01)

(58) Field of Classification Search
CPC ......... G11C 16/26; G11C 16/08; G11C 16/24; G11C 7/12
See application file for complete search history.

(56) References Cited

U.S. PATENT DOCUMENTS

| 5,497,354 A * | 3/1996 | Sweha ................ G11C 11/5621 |
| | | 365/207 |
| 2010/0172174 A1* | 7/2010 | Kim ...................... G11C 7/1039 |
| | | 365/163 |
| 2012/0033501 A1* | 2/2012 | Park .................... G11C 11/5642 |
| | | 365/185.19 |
| 2015/0221351 A1* | 8/2015 | Park ........................ G11C 8/08 |
| | | 365/51 |
| 2018/0040353 A1* | 2/2018 | Lee ......................... G11O 5/147 |
| 2019/0035443 A1* | 1/2019 | Park ....................... G11C 7/227 |

FOREIGN PATENT DOCUMENTS

| KR | 1020100022852 A | 3/2010 |
| KR | 1020100081156 A | 7/2010 |

* cited by examiner

*Primary Examiner* — Toan K Le
(74) *Attorney, Agent, or Firm* — William Park & Associates Ltd.

(57) ABSTRACT

A nonvolatile memory device includes a plurality of memory cells coupled to a single bit line, wherein each of the plurality of memory cells is coupled to a different word line from a plurality of word lines. The nonvolatile memory device includes a decoder configured to sequentially apply a read voltage of a first level to target word lines among the word lines, based on a multi-read command. The nonvolatile memory device includes a read circuit configured to obtain first sensing values of target memory cells coupled to the target word lines, by sensing the bit line each time the read voltage of the first level is applied to each of the target word lines.

20 Claims, 9 Drawing Sheets

NONVOLATILE MEMORY DEVICE AND MEMORY SYSTEM INCLUDING THE NONVOLATILE MEMORY DEVICE

CROSS-REFERENCES TO RELATED APPLICATION

The present application claims priority under 35 U.S.C. § 119(a) to Korean application number 10-2018-0055461, filed on May 15, 2018, in the Korean Intellectual Property Office, which is incorporated herein by reference in its entirety.

BACKGROUND

1. Technical Field

Various embodiments generally relate to a memory device and, more particularly, to a nonvolatile memory device.

2. Related Art

A nonvolatile memory device may retain stored data even though power is not supplied. The nonvolatile memory device may include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

A memory system may include a nonvolatile memory device, and may be configured to store data provided from a host device, in the nonvolatile memory device, in response to a write request of the host device. Also, the memory system may be configured to provide data stored in the nonvolatile memory device, to the host device, in response to a read request of the host device. The host device as an electronic device capable of processing data may include a computer, a digital camera or a mobile phone. The memory system may operate by being built in the host device, or may operate by being manufactured in a separable form and being coupled to the host device.

SUMMARY

In an embodiment, a nonvolatile memory device may include: a plurality of memory cells coupled to a single bit line, wherein each of the plurality of memory cells is coupled to a different word line from a plurality of word lines; a decoder configured to sequentially apply a read voltage of a first level to target word lines among the word lines, based on a multi-read command; and a read circuit configured to obtain first sensing values of target memory cells coupled to the target word lines, by sensing the bit line each time the read voltage of the first level is applied to each of the target word lines.

In an embodiment, a memory system may include: a nonvolatile memory device; and a controller configured to transmit a multi-read command to the nonvolatile memory device, the nonvolatile memory device including a plurality of memory cells coupled to a single bit line, wherein each of the plurality of memory cells is coupled to a different word line from a plurality of word lines; a decoder configured to sequentially apply a read voltage of a first level to target word lines among the word lines, based on the multi-read command; and a read circuit configured to obtain first sensing values of target memory cells coupled to the target word lines, by sensing the bit line each time the read voltage of the first level is applied to each of the target word lines.

In an embodiment, a nonvolatile memory device may include: a memory cell array including memory cells coupled to a plurality of word lines and a plurality of bit lines; a decoder configured to, in order to perform read accesses to target pages based on a multi-read command, sequentially apply a read voltage of a first level to target word lines corresponding to the target pages among the word lines; and a read circuit configured to obtain first sensing values of the respective target pages, by sensing the bit lines each time the read voltage of the first level is applied to each of the target word lines.

DETAILED DESCRIPTION

Figure 1:
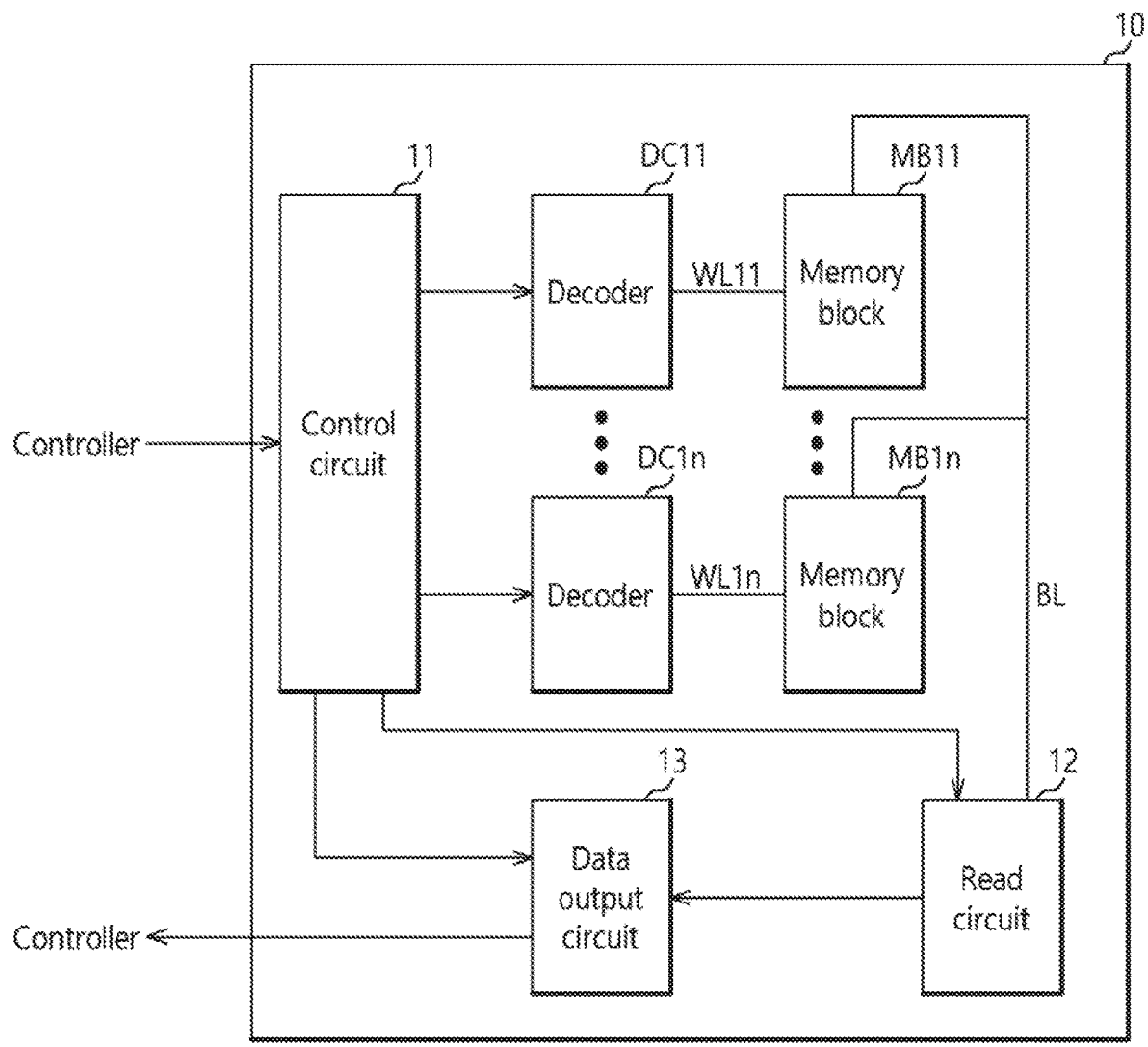
FIG. 1 is a block diagram illustrating a representation of an example of a nonvolatile memory device in accordance with an embodiment.

In the present disclosure, advantages, features and methods for achieving them will become more apparent after a reading of the following examples of embodiments taken in conjunction with the accompanying drawings. The present disclosure may, however, be embodied in different forms and should not be construed as being limited to the embodiments set forth herein. Rather, these embodiments are provided to describe the present disclosure in detail to the extent that a person skilled in the art to which the disclosure pertains can easily carry out the technical ideas of the present disclosure.

It is to be understood herein that embodiments of the present disclosure are not limited to the particulars shown in the drawings and that the drawings are not necessarily to scale and in some instances proportions may have been exaggerated in order to more clearly depict certain features of the disclosure. While particular terminology is used herein, it is to be appreciated that the terminology used herein is for the purpose of describing particular embodiments only and is not intended to limit the scope of the present disclosure.

As used herein, the term "and/or" includes any and all combinations of one or more of the associated listed items. It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes" and/or "including," when used in this specification, specify the presence of at least one stated feature, step, operation, and/or element, but do not preclude the presence or addition of one or more other features, steps, operations, and/or elements thereof.

Hereinafter, a nonvolatile memory device and a memory system including the same will be described below with reference to the accompanying drawings through various examples of embodiments.

FIG. 1 is a block diagram illustrating a representation of an example of a nonvolatile memory device 10 in accordance with an embodiment.

The nonvolatile memory device 10 may store data transmitted from an external controller (not shown) and may read stored data and transmit the read data to the controller, under the control of the controller. In some embodiments, the nonvolatile memory device may include the controller. In some embodiments, the controller may be located outside the nonvolatile memory device.

In particular, the nonvolatile memory device 10 of a present embodiment may receive a multi-read command from the controller, and may perform a multi-read operation in response to the multi-read command. When performing the multi-read operation, the nonvolatile memory device 10 may sequentially select a plurality of target word lines in a memory block and thereby read-access the target pages of the target word lines, and may output at once the data stored in the target pages to the controller. The multi-read operation for the plurality of target word lines may be performed by the one multi-read command.

Meanwhile, when it is necessary to read-access the respective target pages of a plurality of target word lines, according to not a multi-read operation but a normal read operation, the controller may transmit a plurality of normal read commands for the plurality of target word lines. Each time when receiving a normal read command, the nonvolatile memory device 10 may read-access the target page of a corresponding target word line, and may output the data stored in the target page to the controller. That is to say, the normal read operation may be repeated for the plurality of target word lines. In this case, it takes a time to transmit the respective normal read commands.

Therefore, when it is necessary to read-access the target pages of a plurality of target word lines, according to a multi-read operation of the present embodiment, since a time for transmitting normal read commands is eliminated, data may be quickly processed when compared to the case where a normal read operation is repeated.

Also, as will be described below, the nonvolatile memory device 10 may sequentially apply read voltages of the same level to target word lines when performing a multi-read operation. In this case, the nonvolatile memory device 10 does not need to set again the levels of the read voltages. Therefore, in a multi-read operation for a plurality of target word lines, since a process for setting the levels of read voltages is substantially omitted, a time for performing the multi-read operation may be shorter than the case where a normal read operation is repeated.

Referring to FIG. 1, the nonvolatile memory device 10 may include a control circuit 11, a plurality of memory blocks MB11 to MB1$n$, a plurality of decoders DC11 to DC1$n$, a read circuit 12 and a data output circuit 13.

The control circuit 11 may control internal units including the decoders DC11 to DC1$n$, the read circuit 12 and the data output circuit 13 of the nonvolatile memory device 10 in response to a command transmitted from the controller. In particular, the control circuit 11 may control the multi-read operation of the nonvolatile memory device 10 in response to a multi-read command transmitted from the controller.

The multi-read command may include a plurality of addresses. The plurality of addresses may designate a plurality of target pages. The plurality of target pages may be pages which are accessible through a plurality of target word lines in a same memory block.

The control circuit 11 may determine a memory block to be accessed among the memory blocks MB11 to MB1$n$ based on the addresses included in the multi-read command, and may activate a decoder which is coupled to the memory block to be accessed, among the decoders DC11 to DC1$n$. The control circuit 11 may set an appropriate level of a read voltage and an appropriate level of a pass voltage based on the multi-read command, and may transmit the set read voltage and the set pass voltage to the activated decoder. The control circuit 11 may control the activated decoder to apply the read voltage by sequentially selecting target word lines. Further, the control circuit 11 may control the activated decoder to apply the pass voltage simultaneously to word lines to which the read voltage is not applied, while the read voltage is applied to each of the target word lines.

The memory blocks MB11 to MB1$n$ may correspond to the decoders DC11 to DC1$n$, respectively. Each of the memory blocks MB11 to MB1$n$ may be coupled with a corresponding decoder through corresponding word lines (i.e., WL11 to WL1$n$). For example, the memory block MB11 may be coupled with the corresponding decoder DC11 through corresponding word lines WL11. The memory blocks MB11 to MB1$n$ may be coupled with the read circuit 12 through bit lines BL.

Each of the memory blocks MB11 to MB1$n$ may transmit stored data to the read circuit 12 through the bit lines BL when a corresponding decoder is activated.

Each of the memory blocks MB11 to MB1$n$ may include a memory cell array (not shown) for storing data.

Each of the decoders DC11 to DC1$n$ may be coupled with a corresponding memory block through corresponding word lines. For example, the decoder DC11 may be coupled with the corresponding memory block MB11 through the corresponding word lines WL11.

In a multi-read operation, a decoder which is coupled to a memory block to be read-accessed, among the decoders DC11 to DC1$n$, may be activated by the control circuit 11.

Meanwhile, in the multi-read operation, target pages may include pages of the same page level. The target pages of the same page level may be accessed using read voltages of the same level as will be described later.

Thus, the activated decoder may sequentially select target word lines and sequentially apply read voltages of the same level to the target word lines.

While applying the read voltage to each of the target word lines, the activated decoder may apply pass voltages of one or more levels simultaneously to the remaining word lines to which the read voltage is not applied. The levels of the pass voltages may be different depending on whether the remaining word lines are adjacent to a target word line to which the read voltage is currently applied. For example, one or more remaining word lines adjacent to a target word line to which the read voltage is applied may be applied with the pass voltage of a higher level than the other remaining word lines.

The read circuit 12 may sense the bit lines BL every time the read voltages are sequentially applied to the target word lines, and thereby, may obtain the sensing values of the target pages. For example, the read circuit 12 may sense the bit lines BL every time the read voltages are sequentially applied to the target word lines, and thereby, may obtain the sensing values of target memory cells which are coupled to the respective target word lines.

The data output circuit 13 may determine data read from the respective target pages based on the sensing values of the respective target pages, and may output the data to the controller. The data output circuit 13 may output at once the data of the plurality of target pages to the controller.

As a consequence, since a multi-read operation for a plurality of target word lines in accordance with an embodiment is performed through a single multi-read command, a time required to transmit read commands may be eliminated when compared to the case where a normal read operation is repeated. Also, since the plurality of target word lines are applied with read voltages of the same level in the multi-read operation, it is sufficient for the control circuit 11 to initially set only once the level of a read voltage. Due to this fact, when compared to the case where a normal read operation is repeated for target word lines and the level of a read voltage is set each time the normal read operation is performed, efficiency may be provided in that power consumption and a setting time are reduced.

Meanwhile, as will be described later, in a multi-read operation for a plurality of certain target pages, the respective target pages may be read-accessed by being applied with read voltages of a plurality of levels. For example, when read voltages of a first level and a second level should be applied, first, the control circuit 11 may set the level of a read voltage to the first level. An activated decoder may sequentially select target word lines and sequentially apply the read voltages of the first level to the target word lines. The read circuit 12 may sense the bit lines BL every time the read voltages of the first level are sequentially applied to the target word lines, and thereby, may obtain first sensing values of the target pages.

If the process of sequentially applying the read voltages of the first level to all the target word lines is ended, the control circuit 11 may set the level of a read voltage to the second level. The activated decoder may sequentially select the target word lines and sequentially apply the read voltages of the second level to the target word lines. The read circuit 12 may sense the bit lines BL every time the read voltages of the second level are sequentially applied to the target word lines, and thereby, may obtain second sensing values of the target pages.

If the process of sequentially applying the read voltages of the second level to all the target word lines is ended, the data output circuit 13 may determine data read from the target pages based on the first sensing values and the second sensing values for the respective target pages. For example, the data output circuit 13 may determine data read from each target page, based on the first sensing values and the second sensing values of the corresponding target page. The data output circuit 13 may output at once the data of the plurality of target pages to the controller.

The nonvolatile memory device 10 may include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like.

Figure 2A:
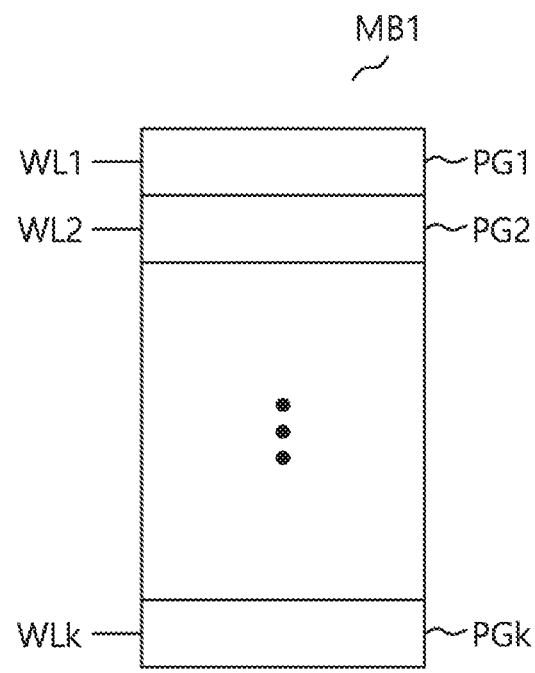
FIGS. 2A and 2B are diagrams illustrating representations of examples of the configurations of a memory block in accordance with an embodiment.

FIGS. 2A and 23 are diagrams illustrating representations of examples of the configurations of a memory block MB1 in accordance with an embodiment.

Referring to FIG. 2A, the memory block MB1 may include a plurality of pages PG1 to PGk. The pages PG1 to PGk may be accessed through word lines WL1 to WLk. Each of the word lines WL1 to WLk may be coupled with a plurality of memory cells (not shown). Therefore, accessing the pages PG1 to PGk may be, physically, accessing the memory cells coupled to the word lines WL1 to WLk. For example, each memory cell from the plurality of memory cells may be coupled to a single word line from the plurality of word lines WL1 to WLk (i.e., a first memory cell may be coupled to a first word line WL1, a second memory cell may be coupled to a second word line WL2, and so forth). In an embodiment, first memory cells for a plurality of memory strings may be coupled to a single word line (i.e., first word line WL1) to constitute a page.

If one memory cell stores only one bit, the memory cells coupled to one word line may be related with only one page. In this case, one page may be accessed through one word line. The pages PG1 to PGk may correspond to the same page level unlike descriptions to be made below.

Unlike the illustration of FIG. 2A, one memory cell may store two or more bits. Two or more bits stored in one memory cell may correspond to a lowest level to a highest level, respectively. Two or more bits stored in one memory cell may be stored in different pages depending on a level, that is, pages having different page levels.

The page level of each page may be determined as one of a lowest level to a highest level depending on the level of the bits stored in the corresponding page. As a result, a single word line may be related with i number of pages when each of the memory cells coupled to the corresponding word line stores i number of bits. The i number of pages may be classified as i number of page levels.

Figure 2B:
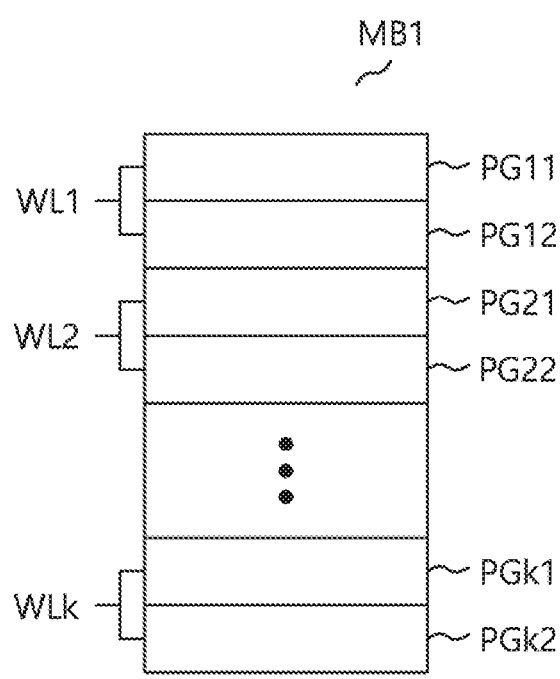

For example, when one memory cell stores two bits in FIG. 2B, the memory block MB1 may include a plurality of pages PG11 to PGk2. When one memory cell stores two bits, a single word line may be related with two pages. Two bits stored in one memory cell may be stored in two pages, respectively. Of the two bits stored in one memory cell, a bit of a lowest level, that is, an LSB (least significant bit), may be stored in a page of a lowest level, that is, an LSB page. Of the two bits stored in one memory cell, a bit of a highest level, that is, an MSB (most significant bit), may be stored in a page of a highest level, that is, an MSB page.

Figure 3A:
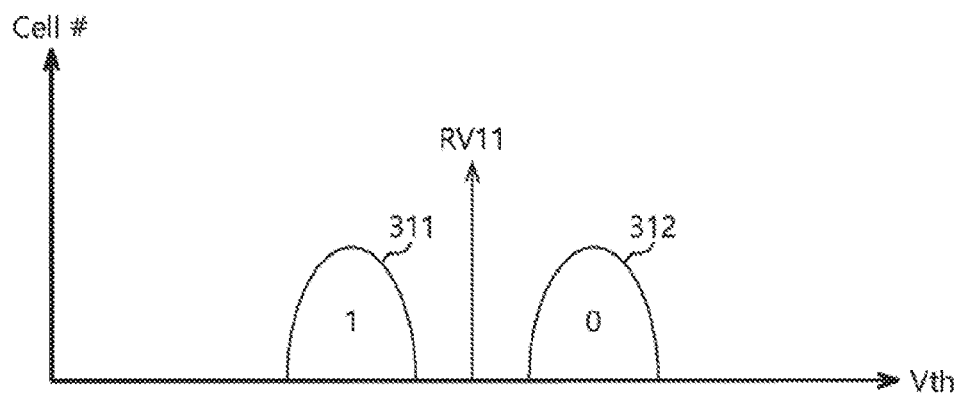
FIGS. 3A and 3B are diagrams illustrating representations of examples of threshold voltage distributions of memory cells.
Figure 3B:
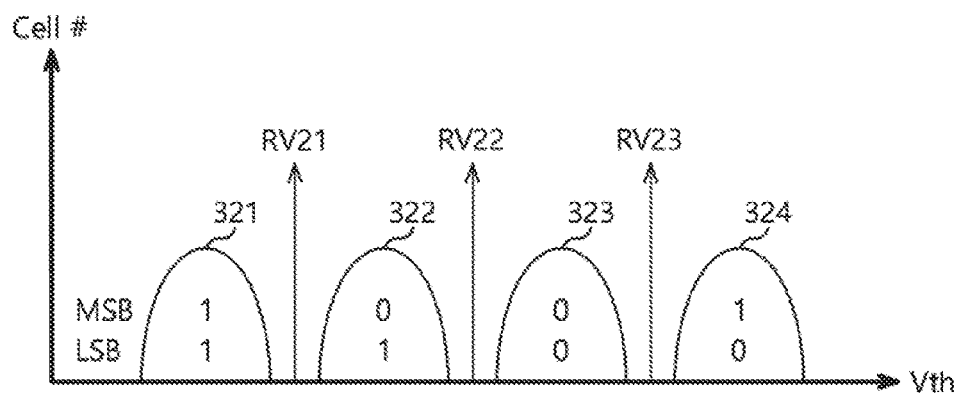

FIGS. 3A and 3B are diagrams illustrating representations of examples of threshold voltage distributions of memory cells. The horizontal axis Vth may mean the threshold voltage of a memory cell, and the vertical axis Cell # may mean the number of memory cells corresponding to a threshold voltage. FIG. 3A illustrates a case where one bit is stored in each memory cell, and FIG. 3B illustrates a case where two bits are stored in each memory cell.

Referring to FIG. 3A, memory cells may form threshold voltage distributions 311 and 312 depending on data stored therein. A memory cell may be controlled to have a threshold voltage corresponding to any one of the two threshold voltage distributions 311 and 312, depending on one-bit data to be stored therein. For example, a memory cell in which "1" is stored may have a threshold voltage corresponding to the threshold voltage distribution 311, and a memory cell in which "0" is stored may have a threshold voltage corresponding to the threshold voltage distribution 312.

Each memory cell may be turned on or off depending on its threshold voltage when it is applied with a read voltage of a predetermined level through a word line. For example, a memory cell may be turned on when it is applied with a read voltage of a level higher than its threshold voltage, and may be turned off when it is applied with a read voltage of a level lower than its threshold voltage. Therefore, a read voltage for the memory cells forming the threshold voltage distributions 311 and 312 may be set to a level RV11 between the threshold voltage distributions 311 and 312.

The read circuit 12 of FIG. 1 may sense the turn-on or turn-off of a memory cell through a bit line BL which is coupled to the memory cell, when the read voltage of the level RV11 is applied. The read circuit 12 may determine whether the threshold voltage of the memory cell is higher or lower than the read voltage of the level RV11, by a sensing value. In other words, the read circuit 12 may determine a threshold voltage distribution in which the memory cell is positioned, and as a result, may determine data stored in the memory cell.

Referring to FIG. 3B, memory cells may form threshold voltage distributions 321 to 324 depending on data stored therein. A memory cell may be controlled to have a threshold voltage corresponding to any one of the four threshold voltage distributions 321 to 324, depending on two-bit data to be stored therein. For example, a memory cell in which "11" is stored may have a threshold voltage corresponding to the threshold voltage distribution 321, a memory cell in which "01" is stored may have a threshold voltage corresponding to the threshold voltage distribution 322, a memory cell in which "00" is stored may have a threshold voltage corresponding to the threshold voltage distribution 323, and a memory cell in which "10" is stored may have a threshold voltage corresponding to the threshold voltage distribution 324. Two-bit data, that is, LSB data and MSB data, stored in each of the memory cells may be stored in an LSB page and an MSB page, respectively.

When i number of bits are stored in each memory cell, memory cells may form $2^i$ number of threshold voltage distributions.

Read voltages for the memory cells forming the threshold voltage distributions 321 to 324 may be set to levels RV21 to RV23 between the threshold voltage distributions 321 to 324. When the read voltages of the respective levels RV21 to RV23 are applied, the read circuit 12 of FIG. 1 may determine, by sensing values, whether the threshold voltages of the memory cells are higher or lower than the read voltages of the respective levels RV21 to RV23. In other words, the read circuit 12 may determine a threshold voltage distribution in which each memory cell is positioned, and as a result, may determine data stored in the memory cell.

Read voltages of different levels may be used depending on the level of a target page to be read-accessed. For example, when a target page is an LSB page, the read voltage of the level RV22 between the threshold voltage distributions 322 and 323 in which LSB data changes from "1" to "0" may be used. When a target page is an MSB page, the read voltage of the level RV21 between the threshold voltage distributions 321 and 322 in which MSB data changes from "1" to "0" and the read voltage of the level RV23 between the threshold voltage distributions 323 and 324 in which MSB data changes from "0" to "1" may be used.

Figure 4:
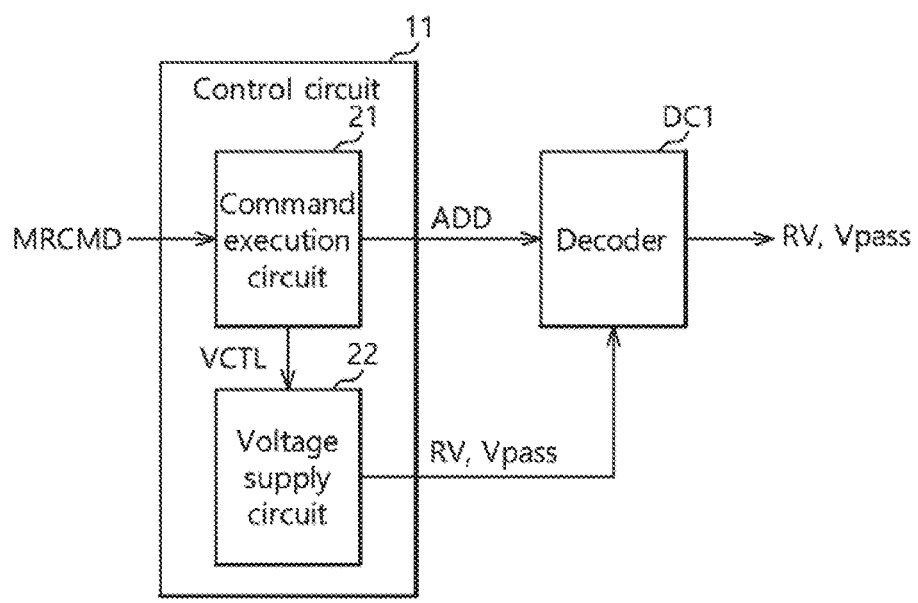
FIG. 4 is a block diagram illustrating a representation of an example of the configuration of the control circuit illustrated in FIG. 1.

FIG. 4 is a block diagram illustrating a representation of an example of the configuration of the control circuit 11 illustrated in FIG. 1. FIG. 4 additionally illustrates a decoder DC1 to be activated by the control circuit 11. The control circuit 11 may activate the respective decoders DC11 to DC1n of FIG. 1 in the same manner as activating the decoder DC1 in FIG. 4.

The control circuit 11 may include a command execution circuit 21 and a voltage supply circuit 22.

The command execution circuit 21 may receive a multi-read command MRCMD transmitted from the controller. The command execution circuit 21 may activate the decoder DC1 which is coupled to a memory block to be accessed based on addresses ADD included in the multi-read command MRCMD. The command execution circuit 21 may transmit a predetermined activation signal (not shown) to the decoder DC1 to activate the decoder DC1.

The command execution circuit 21 may control the decoder DC1 to sequentially select target word lines and apply a read voltage RV, The command execution circuit 21 may transmit the addresses ADD included in the multi-read command MRCMD to the decoder DC1 to allow the decoder DC1 to sequentially select the plurality of target word lines. Further, the command execution circuit 21 may control the decoder DC1 to apply a pass voltage Vpass simultaneously to word lines to which the read voltage RV is not applied, while the read voltage RV is applied to each of the target word lines.

The command execution circuit 21 may control, based on the multi-read command MRCMD, the voltage supply circuit 22 to set an appropriate level of the read voltage RV and an appropriate level of the pass voltage Vpass and transmit the set read voltage RV and pass voltage Vpass to the decoder DC1. The command execution circuit 21 may transmit a voltage control signal VCTR to the voltage supply circuit 22 to control the voltage supply circuit 22.

The voltage supply circuit 22 may set the appropriate level of the read voltage RV and the appropriate level of the pass voltage Vpass and transmit the set read voltage RV and pass voltage Vpass to the decoder DC1, under the control of the command execution circuit 21.

Figure 5:
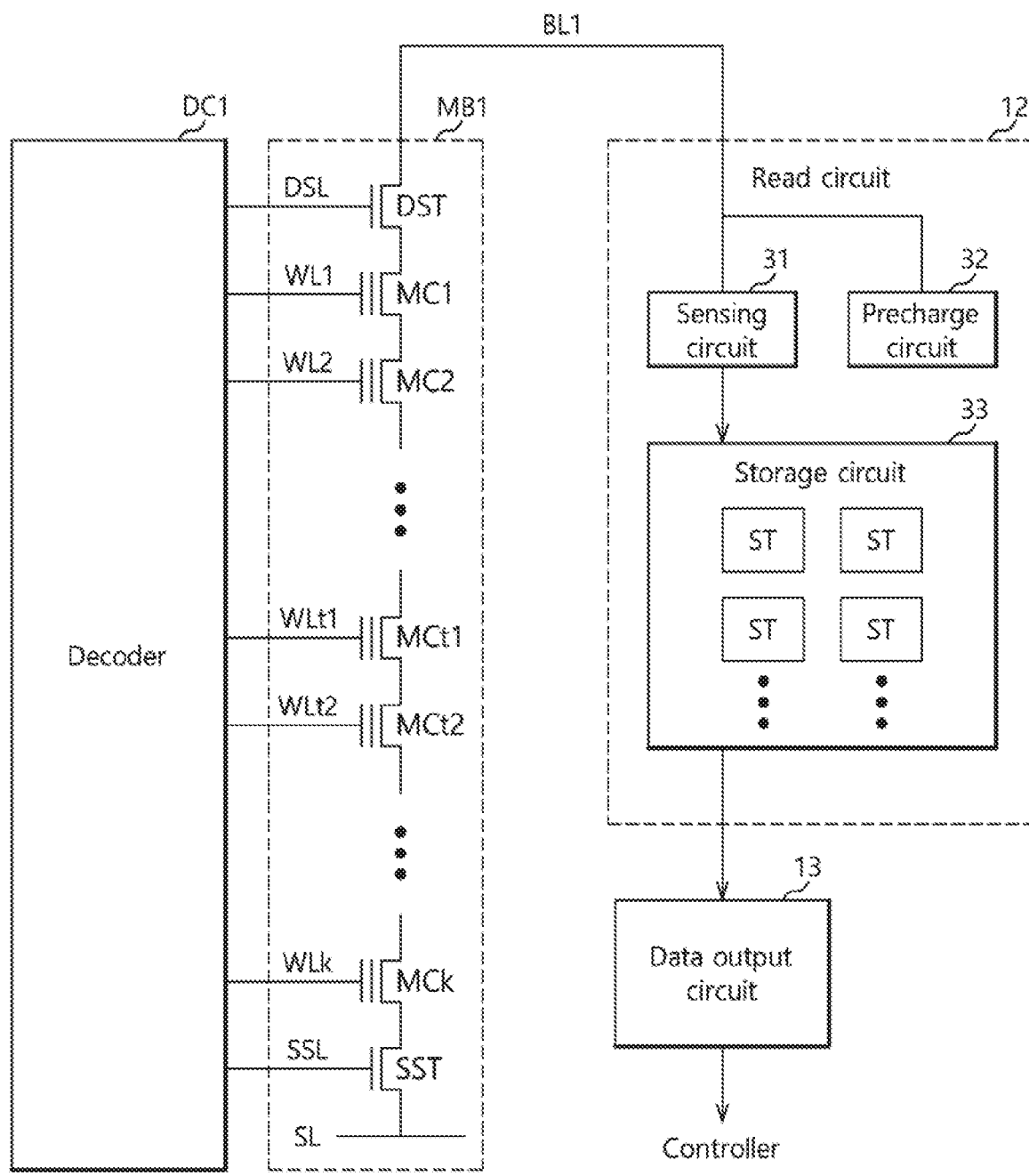
FIG. 5 is a block diagram illustrating a representation of an example of the configuration of the read circuit illustrated in FIG. 1.

FIG. 5 is a block diagram illustrating a representation of an example of the configuration of the read circuit 12 illustrated in FIG. 1. FIG. 5 additionally illustrates the configuration of a memory block MB1 regarding one bit line BL1 which is coupled to the read circuit 12. The respective bit lines BL of FIG. 1 may be configured and operate in substantially the same manner as the bit line BL1 of FIG. 5 in each of the memory blocks MB11 to MB1n.

Further, FIG. 5 additionally illustrates a decoder DC1 which is coupled to the memory block MB1. The respective decoders DC11 to DC1n of FIG. 1 may be configured and operate in substantially the same manner as the decoder DC1 of FIG. 5.

Referring to FIG. 5, first, the memory block MB1 may include a drain select transistor DST, memory cells MC1 to MCk and a source select transistor SST. The drain select transistor DST, the memory cells MC1 to MCk and the source select transistor SST may be coupled between the bit line BL1 and a source line SL.

The drain select transistor DST may have a drain which is coupled to the bit line BL1, a source which is coupled to the memory cell MC1 and a gate which is coupled to a drain select line DSL.

The source select transistor SST may have a drain which is coupled to the memory cell MCk, a source which is coupled to the source line SL and a gate which is coupled to a source select line SSL.

The memory cells MC1 to MCk may be coupled in series between the drain select transistor DST and the source select transistor SST. The gates of the memory cells MC1 to MCk may be coupled to word lines WL1 to WLk, respectively.

While not shown, the memory block MB1 may further include memory cells which are coupled to each of the word lines WL1 to WLk, and memory cells which are coupled to a single word line may be respectively coupled to the bit lines BL of FIG. 1.

A target memory cell among the memory cells MC1 to MCk may be read-accessed when a corresponding word line is selected and is applied with a read voltage. The target memory cell among the memory cells MC1 to MCk may be turned on or off depending on whether the read voltage of a predetermined level applied to the corresponding word line is higher or lower than its threshold voltage, and thereby, may transmit data to the bit line BL1.

The bit line BL1 may transmit data transmitted from the target memory cell among the memory cells MC1 to MCk, to the read circuit 12.

The decoder DC1 may be coupled to the word lines WL1 to WLk. The decoder DC1 may select a target word line and apply the read voltage of the predetermined level to the target word line, under the control of the control circuit 11.

The read circuit 12 may include a sensing circuit 31, a precharge circuit 32 and a storage circuit 33.

The sensing circuit 31 may be coupled to the bit line BL1. When the read voltage is applied to the target word line of the target memory cell, the sensing circuit 31 may obtain a sensing value by sensing the bit line BL1 and store the sensing value in the storage circuit 33.

The precharge circuit 32 may be coupled to the bit line BL1. The precharge circuit 32 may precharge the bit line BL1 before the target memory cell is read-accessed.

The storage circuit 33 may be coupled to the sensing circuit 31 and may be coupled to the data output circuit 13. The storage circuit 33 may include a plurality of storage elements ST. The storage elements ST may respectively store sensing values obtained to from the bit line BL1 by the sensing circuit 31. The storage elements ST may respectively store sensing values obtained every time read voltages of the same level are sequentially applied to a plurality of target word lines. Each of the storage elements ST may be configured by a fuse, a latch, a register, a flip-flop or the like.

Figure 6:
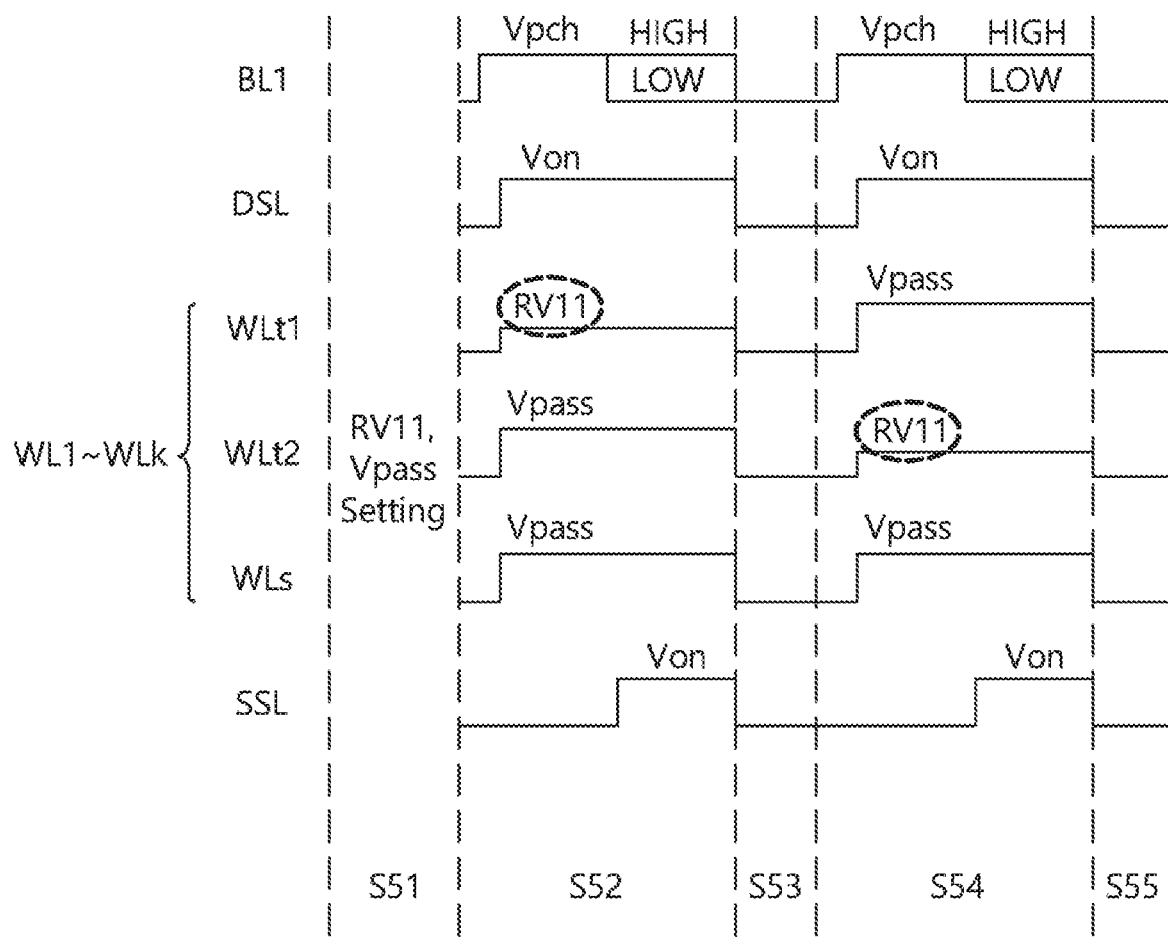
FIG. 6 is a representation of an example of a diagram to assist in the explanation of a method for the nonvolatile memory device of FIG. 1 to perform a multi-read operation.

FIG. 6 is a representation of an example of a diagram to assist in the explanation of a method for the nonvolatile memory device 10 of FIG. 1 to perform a multi-read operation.

Hereinbelow, a method for performing a multi-read operation for the target pages of first and second target word lines WLt1 and WLt2, for example, when one bit is stored in each memory cell in the memory block MB1 will be described with reference to FIG. 6. Since one bit is stored in each memory cell, each of the first and second target word lines WLt1 and WLt2 may be related with one target page.

Meanwhile, a method of physically accessing first and second target memory cells MCt1 and MCt2 coupled to the first and second target word lines WLt1 and WLt2 will be described representatively. The other unillustrated target memory cells coupled to the first and second target word lines WM and WLt2 may be accessed in the same manner as the first and second target memory cells MCt1 and MCt2.

Also, since one bit is stored in each memory cell, each of the first and second target memory cells MCt1 and MCt2 may be read-accessed by using a read voltage of one level, for example, the read voltage of the level RV11 of FIG. 3A. The decoder DC1 may sequentially apply the read voltages of the same level RV11 to the first and second target word lines WLt1 and WLt2 at steps S52 and S54 to be described below.

First, at step S51, when a multi-read command is transmitted for the target pages of the first and second target word lines WLt1 and WLt2, the control circuit 11 may set the level RV11 of the read voltage of FIG. 3A. Also, the control circuit 11 may set the level Vpass of the pass voltage. The level RV11 of the read voltage and the level Vpass of the pass voltage may be memorized in advance by the control circuit 11 or may be transmitted from the controller. While pass voltages of one or more levels may be used according to an embodiment, it will be described in the present embodiment that the pass voltage of one level Vpass is used.

At step S52, the precharge circuit 32 may precharge the bit line BL1 to a level Vpch of a predetermined precharge voltage.

The word "predetermined" as used herein with respect to a parameter, such as a predetermined precharge voltage, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The decoder DC1 may apply a predetermined turn-on voltage Von to the drain select line DSL. The decoder DC1 may select the first target word line WLt1 and apply the read voltage of the level RV11 to the first target word line WLt1. The decoder DC1 may apply the pass voltage of the level Vpass to word lines except the first target word line WLt1 among the word lines WL1 to WLk, that is, the second target word line WLt2 and remaining word lines WLs.

The decoder DC1 may apply a predetermined turn-on voltage Von to the source select line SSL.

Therefore, all of memory cells except the first target memory cell MCt1 among the memory cells MC1 to MCk, the drain select transistor DST and the source select transistor SST may be turned on. The first target memory cell MCt1 may be turned on or off when the read voltage of the level RV11 applied to the first target word line WLt1 is higher or lower than its threshold voltage.

When the first target memory cell MCt1 is turned on, since the voltage precharged to the bit line BL1 is discharged to the source line SL, the level of the bit line BL1 may be LOW. Conversely, when the first target memory cell MCt1 is turned off, since the voltage precharged to the bit line BL1 is maintained, the level of the bit line BL1 may be maintained at HIGH. The sensing circuit 31 may sense whether the level of the bit line BL1 is LOW or HIGH, and may store the sensing value of the first target memory cell MCt1 in the storage circuit 33.

At step S53, the decoder DC1 may discharge the drain select line DSL, all the word lines WL1 to WLk and the source select line SSL. The precharge circuit 32 may discharge the bit line BL1.

At step S54, the precharge circuit 32 may precharge the bit line BL1 to the level Vpch of the predetermined precharge voltage.

The decoder DC1 may apply the predetermined turn-on voltage Von to the drain select line DSL. The decoder DC1 may select the second target word line WLt2 and apply the read voltage of the set level RV11 to the second target word line WLt2. The decoder DC1 may apply the pass voltage of the level Vpass to word lines except the second target word line WLt2 among the word lines WL1 to WLk, that is, the first target word line WLt1 and the remaining word lines WLs. In this regard, the control circuit 11 may supply the level RV11 of the read voltage and the level Vpass of the pass voltage which are set at the step S51, to the decoder DC1, as they are.

The decoder DC1 may apply the predetermined turn-on voltage Von to the source select line SSL.

Therefore, all of memory cells except the second target memory cell MCt2 among the memory cells MC1 to MCk, the drain select transistor DST and the source select transistor SST may be turned on. The second target memory cell MCt2 may be turned on or off when the read voltage of the level RV11 applied to the second target word line WLt2 is higher or lower than its threshold voltage.

When the second target memory cell MCt2 is turned on, since the voltage precharged to the bit line BL1 is discharged to the source line SL, the level of the bit line BL1 may be LOW, Conversely, when the second target memory cell MCt2 is turned off, since the voltage precharged to the bit line BL1 is maintained, the level of the bit line BL1 may be maintained at HIGH. The sensing circuit 31 may sense whether the level of the bit line BL1 is LOW or HIGH, and may store the sensing value of the second target memory cell MCt2 in the storage circuit 33.

At step S55, the decoder DC1 may discharge the drain select line DSL, all the word lines WL1 to WLk and the source select line SSL. The precharge circuit 32 may discharge the bit line BL1.

The other target memory cells coupled to the first and second target word lines WLt1 and WLt2 may operate similarly to the first and second target memory cells MCt1 and MCt2, when the read voltage is applied to the first and second target word lines WLt1 and WLt2 at the steps S52 and S54. Thus, the read circuit 12 may sense the sensing values of the other target memory cells similarly as the sensing values of the first and second target memory cells MCt1 and MCt2 are sensed.

The data output circuit 13 may determine data read from the target page of the first target word line WLt1, based on the sensing values of the target memory cells coupled to the first target word line WLt1. Moreover, the data output circuit 13 may determine data read from the target page of the second target word line WLt2, based on the sensing values of the target memory cells coupled to the second target word line WLt2. The data output circuit 13 may output together the data read from the target pages of the first and second target word lines WLt1 and WLt2, to the controller.

FIG. 6 illustrates the case where the read voltage of one level RV11 is used when only one bit is stored in each memory cell. However, even when two bits are stored in each memory cell, if all target pages are LSB pages, a multi-read operation may be performed in substantially the same manner as described above with reference to FIG. 6, by using the read voltage of the level RV22 of FIG. 3B.

When two bits are stored in each memory cell, an MSB page may be read-accessed by using the read voltages of the two levels RV21 and RV23 of FIG. 3B. In this case, a multi-read operation may be performed as will be described below.

Figure 7:
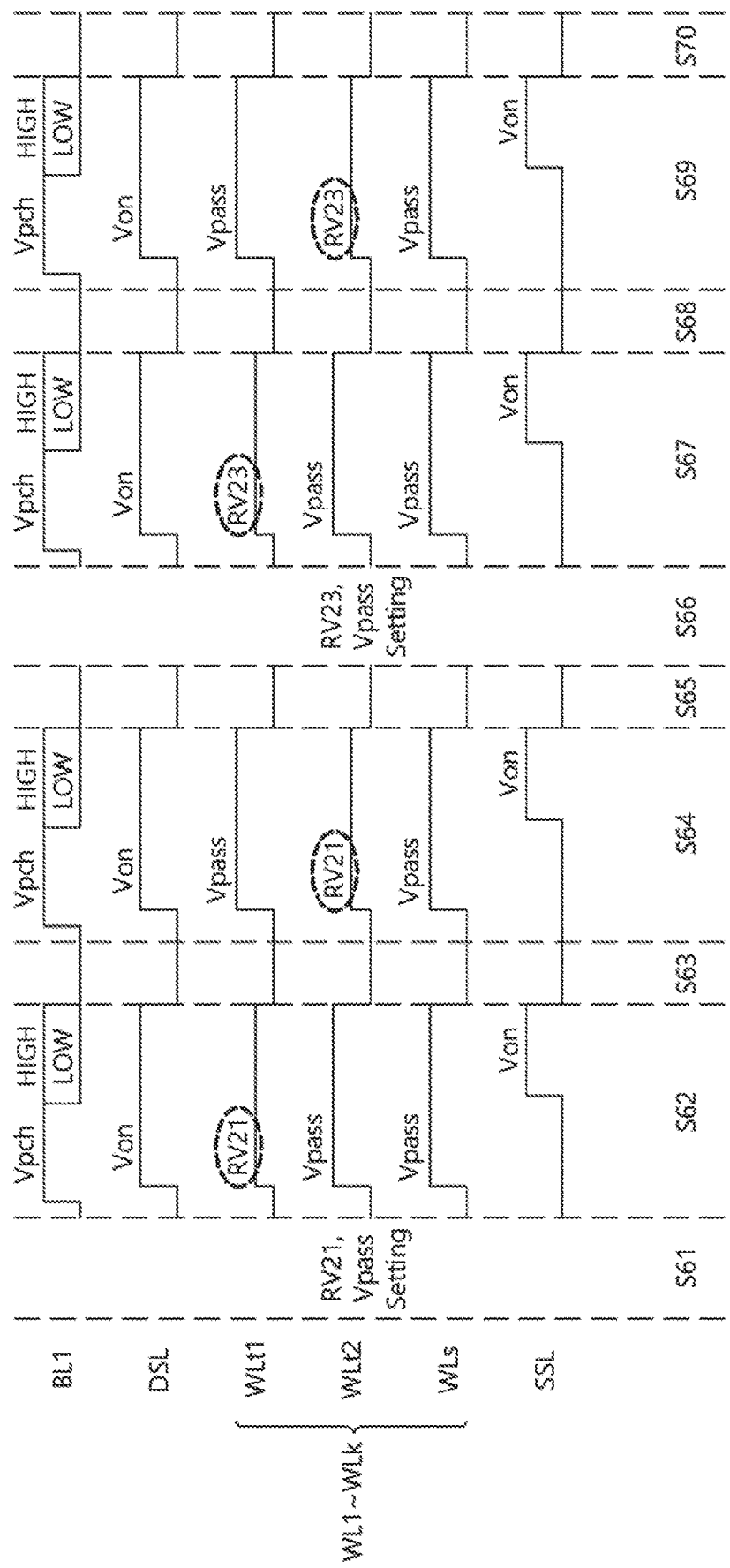
FIG. 7 is a representation of an example of a diagram to assist in the explanation of a method for the nonvolatile memory device of FIG. 1 to perform a multi-read operation.

FIG. 7 is a representation of an example of a diagram to assist in the explanation of a method for the nonvolatile memory device 10 of FIG. 1 to perform a multi-read operation.

Hereinbelow, a method for performing a multi read operation for the target MSB pages of first and second target word lines WLt1 and WLt2, for example, when two bits are stored in each memory cell in the memory block MB1 will be described with reference to FIG. 7.

Meanwhile, a method of physically accessing first and second target memory cells MCt1 and MCt2 coupled to the first and second target word lines WLt1 and WLt2 will be described representatively. The other unillustrated target memory cells coupled to the first and second target word lines WLt1 and WLt2 may be accessed in the same manner as the first and second target memory cells MCt1 and MCt2.

Also, since two bits are stored in each memory cell, each of the first and second target memory cells MCt1 and MCt2 may be read-accessed by using the read voltages of the two levels RV21 and RV23 of FIG. 3B.

First, at step S61, when a multi-read command is transmitted for the target MSB pages of the first and second target word lines WLt1 and WLt2, the control circuit 11 may set the first level RV21 of the read voltage of FIG. 3B. Also, the control circuit 11 may set the level Vpass of the pass voltage. The level RV21 of the read voltage and the level Vpass of the pass voltage may be memorized in advance by the control circuit 11 or may be transmitted from the controller.

Steps S62 to S65 may be performed substantially the same as the steps S52 to S55 of FIG. 6. That is to say, the decoder DC1 may sequentially apply the read voltages of the first level RV21 to the first and second target word lines WLt1 and WLt2, and the sensing circuit 31 may store first sensing values of the first and second target memory cells MCt1 and MCt2 based on the read voltage of the first level RV21, in the storage circuit 33.

At step S66, the control circuit 11 may set the second level RV23 of the read voltage of FIG. 3B.

Steps S67 to S70 may be performed substantially the same as the steps S62 to S65 of FIG. 7. That is to say, the decoder DC1 may sequentially apply the read voltages of the second level RV23 to the first and second target word lines WLt1 and WLt2, and the sensing circuit 31 may store second sensing values of the first and second target memory cells MCt1 and MCt2 based on the read voltage of the second level RV23, in the storage circuit 33.

The data output circuit 13 may determine data read from the target MSB page of the first target word line WLt1, based on the first sensing values and the second sensing values of the target memory cells coupled to the first target word line WLt1. The data output circuit 13 may determine data read from the target MSB page of the second target word line WLt2, based on the first sensing values and the second sensing values of the target memory cells coupled to the second target word line WLt2. The data output circuit 13 may output together the data read from the target MSB pages of the first and second target word lines WLt1 and WLt2, to the controller.

According to an embodiment, a multi-read operation may be performed simultaneously for the LSB and MSB pages of the first and second target word lines WLt1 and WLt2. For example, as the read voltages of the three levels RV21 to RV23 are sequentially applied to the first and second target word lines WLt1 and WLt2, all of the LSB and MSB pages of the first and second target word lines WLt1 and WLt2 may be read-accessed. A sequence in which the read voltages of the three levels RV21 to RV23 are applied may be irrelevant. For example, the read voltage of the level RV21 may be sequentially applied to the first and second target word lines WLt1 and WLt2, the read voltage of the level RV22 may be sequentially applied to the first and second target word lines WLt1 and WLt2, and the read voltage of the level RV23 may be sequentially applied to the first and second target word lines WLt1 and WLt2.

Figure 8:
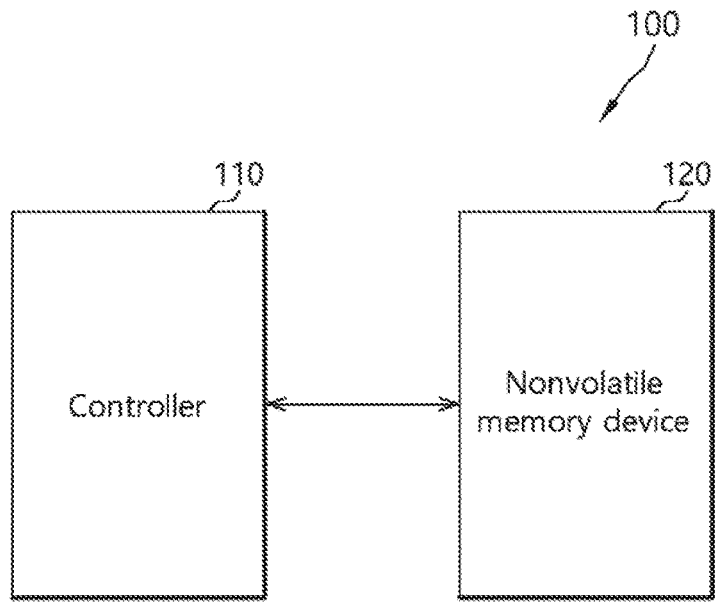
FIG. 8 is a block diagram illustrating a representation of an example of a memory system in accordance with an embodiment.

FIG. 8 is a block diagram illustrating a representation of an example of a memory system 100 in accordance with an embodiment.

The memory system 100 may be configured to store data provided from an external host device, in response to a write request of the host device. Also, the memory system 100 may be configured to provide stored data to the host device, in response to a read request of the host device.

The memory system 100 may be configured by a Personal Computer Memory Card International Association (PCM-CIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

The memory system 100 may include a controller 110 and a nonvolatile memory device 120.

The controller 110 may control general operations of the memory system 100. The controller 110 may access the nonvolatile memory device 120 to process a request of the host device. Also, the controller 110 may access the nonvolatile memory device 120 to perform an internal management operation or a background operation of the memory system 100 regardless of a request of the host device. An access to the nonvolatile memory device 120 may include a write access and a read access.

According to an embodiment, the controller 110 may transmit a multi-read command to the nonvolatile memory device 120 when it is determined that sequential read requests are received from the host device. In this case, the multi-read command may be one to read-access the target pages of target word lines which are successive in a memory block. The successive target word lines may be the word lines of target pages which are already read-requested from the host device or the word lines of target pages which are expected to be read-requested afterwards.

The nonvolatile memory device 120 may be configured and operate substantially the same as the nonvolatile memory devices 10 of FIG. 1.

Figure 9:
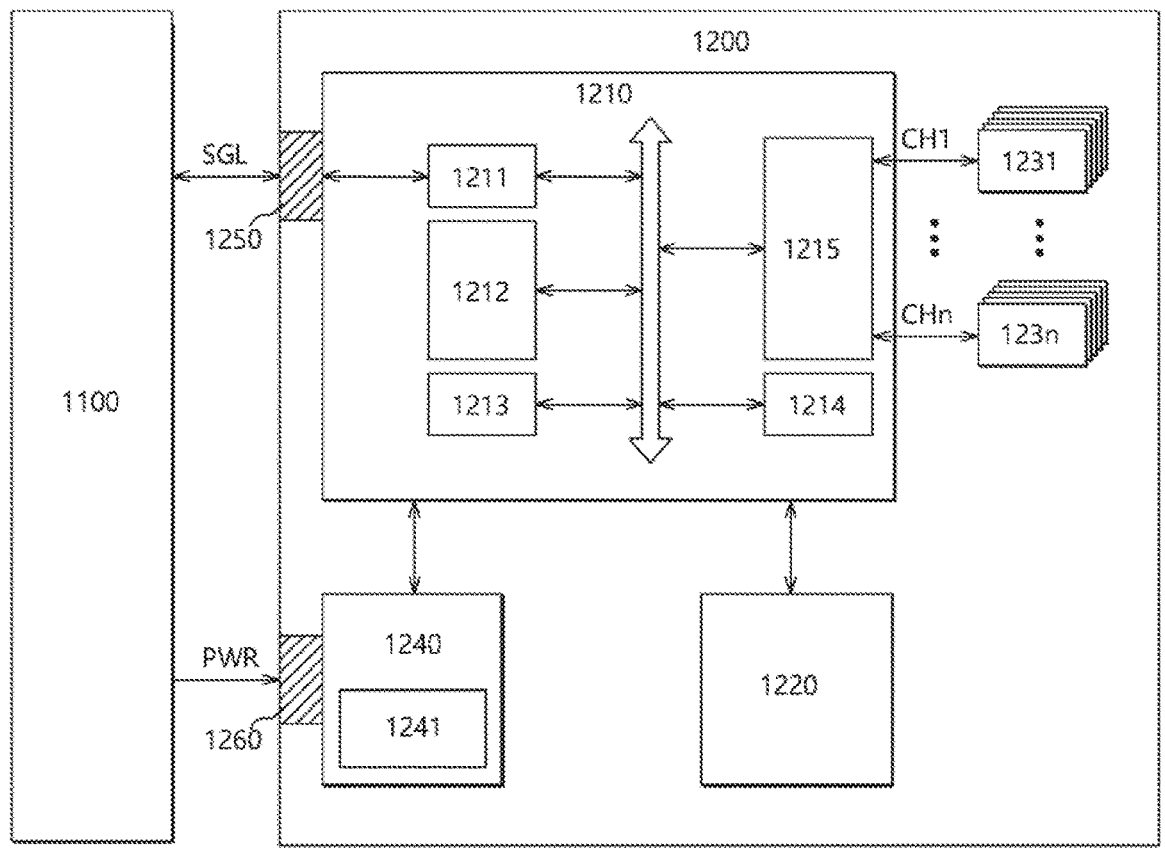
FIG. 9 is a diagram illustrating a data processing system including a solid state drive (SSD) in accordance with an embodiment.

FIG. 9 is a diagram illustrating a data processing system 1000 including a solid state drive (SSD) 1200 in accordance with an embodiment. Referring to FIG. 9, the data processing system 1000 may include a host device 1100 and the SSD 1200.

The SSD 1200 may include a controller 1210, a buffer memory device 1220, a plurality of nonvolatile memory devices 1231 to 123n, a power supply 1240, a signal connector 1250, and a power connector 1260.

The controller 1210 may control general operations of the SSD 1200. The controller 1210 may control a multi-read operation of the nonvolatile memory devices 1231 to 123n, similarly to the controller 110 illustrated in FIG. 8. The controller 1210 may control the multi-read operation of the nonvolatile memory devices 1231 to 123n when it is determined that sequential read requests are received from the host device.

The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E) and universal flash storage (UFS), etc.

The control unit 1212 may analyze and process the signal SGL received from the host device 1100. The control unit 1212 may control operations of internal function blocks according to a firmware or a software for driving the SSD 1200. The random access memory 1213 may be used as a working memory for driving such a firmware or software.

The ECC unit 1214 may generate the parity data of data to be transmitted to at least one of the nonvolatile memory devices 1231 to 123n. The generated parity data may be stored together with the data in the nonvolatile memory devices 1231 to 123n. The ECC unit 1214 may detect an error of the data read from at least one of the nonvolatile memory devices 1231 to 123n, based on the parity data. If a detected error is within a correctable range, the ECC unit 1214 may correct the detected error.

The memory interface unit 1215 may provide control signals such as commands and addresses to at least one of the nonvolatile memory devices 1231 to 123n, according to control of the control unit 1212. Moreover, the memory interface unit 1215 may exchange data with at least one of the nonvolatile memory devices 1231 to 123n, according to control of the control unit 1212. For example, the memory interface unit 1215 may provide the data stored in the buffer memory device 1220, to at least one of the nonvolatile memory devices 1231 to 123n, or provide the data read from at least one of the nonvolatile memory devices 1231 to 123n, to the buffer memory device 1220.

The buffer memory device 1220 may temporarily store data to be stored in at least one of the nonvolatile memory devices 1231 to 123n. Further, the buffer memory device 1220 may temporarily store the data read from at least one of the nonvolatile memory devices 1231 to 123n. The data temporarily stored in the buffer memory device 1220 may be transmitted to the host device 1100 or at least one of the nonvolatile memory devices 1231 to 123n according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

Each of the nonvolatile memory devices 1231 to 123n may be configured in the same manner as the nonvolatile memory devices 10 illustrated in FIG. 1. Each of the nonvolatile memory devices 1231 to 123n may perform the multi-read operation according to a control of the controller 1210.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 10:
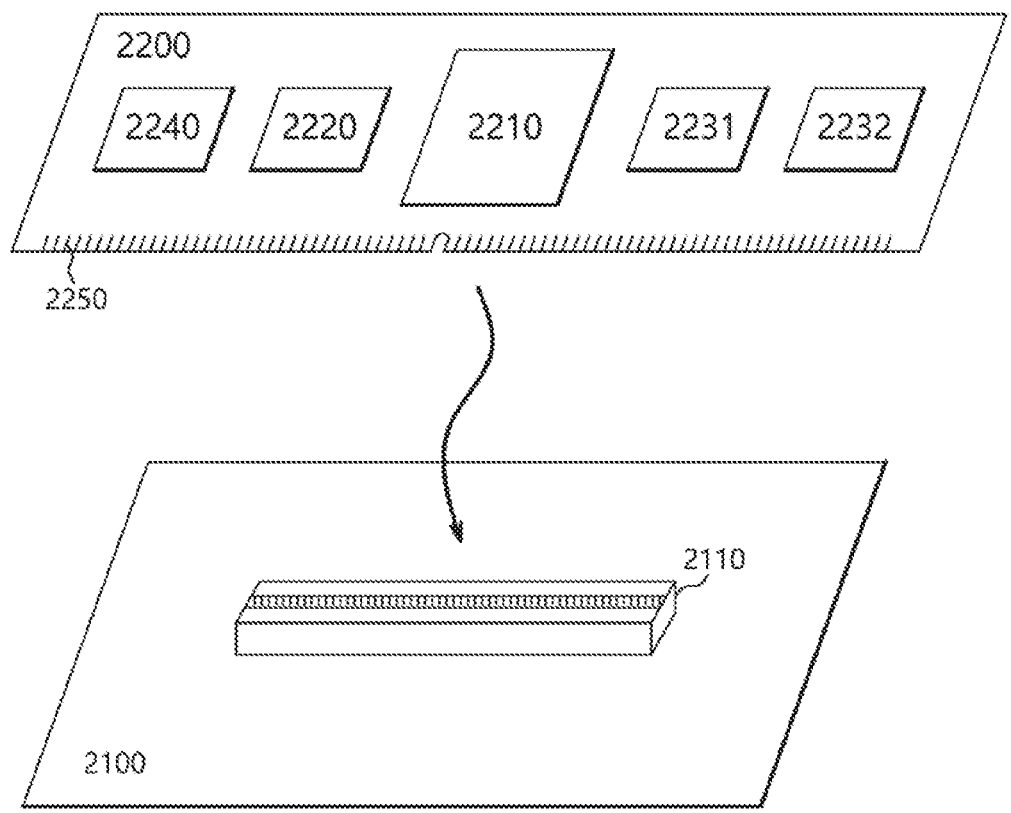
FIG. 10 is a diagram illustrating a data processing system including a memory system in accordance with an embodiment.

FIG. 10 is a diagram illustrating a data processing system 2000 including a memory system 2200 in accordance with an embodiment. Referring to FIG. 10, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 illustrated in FIG. 9.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the inside of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be configured into various types depending on an interface scheme between the host device 2100 and the memory system 2200. The connection terminal 2250 may be disposed on any one side of the memory system 2200.

Figure 11:
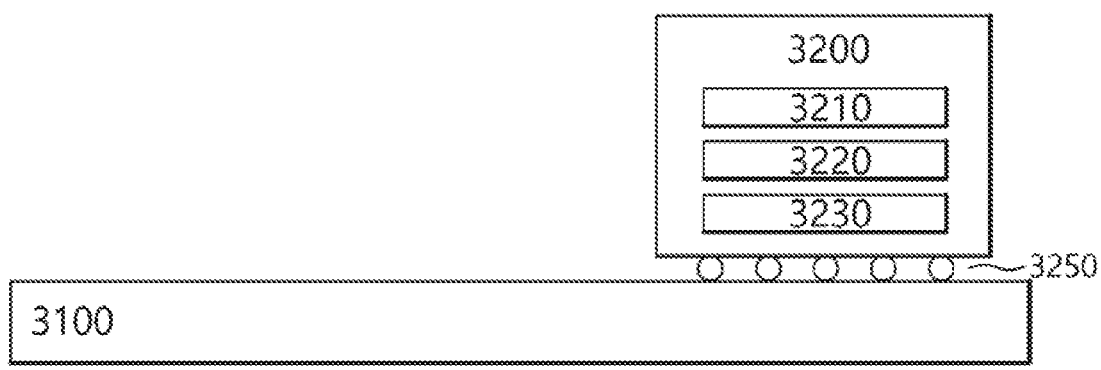
FIG. 11 is a diagram illustrating a data processing system including a memory system in accordance with an embodiment.

FIG. 11 is a diagram illustrating a data processing system 3000 including a memory system 3200 in accordance with an embodiment. Referring to FIG. 11, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 1210 illustrated in FIG. 9.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 12:
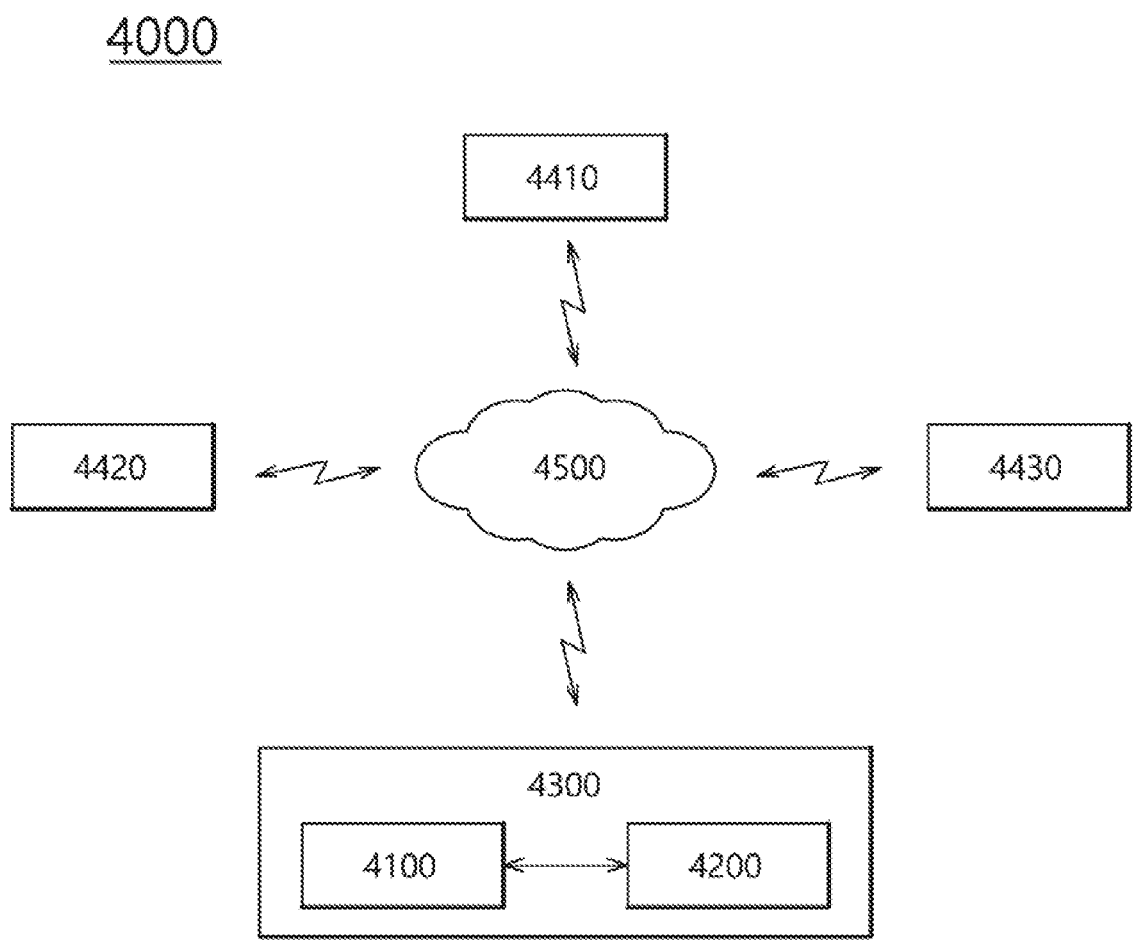
FIG. 12 is a diagram illustrating a network system including a memory system in accordance with an embodiment.

FIG. 12 is a diagram illustrating a network system 4000 including a memory system 4200 in accordance with an embodiment. Referring to FIG. 12, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 100 illustrated in FIG. 8, the memory system 1200 illustrated in FIG. 9, the memory system 2200 illustrated in FIG. 10 or the memory system 3200 illustrated in FIG. 11.

While various embodiments have been described above, it will be understood to those skilled in the art that the embodiments described are examples only. Accordingly, the nonvolatile memory device and the memory system including the same described herein should not be limited based on the described embodiments.

What is claimed is:

1. A nonvolatile memory device comprising:
   a plurality of memory cells coupled to a single bit line, wherein each of the plurality of memory cells is coupled to a different word line from a plurality of word lines;
   a decoder configured to apply a read voltage of a first level y sequentially selecting target word lines among the word lines, based on a multi-read command to read-access to the plurality of target word lines; and
   a read circuit configured to obtain first sensing values of target memory cells coupled to the target word lines, by sensing the bit line each time the read voltage of the first level is applied to each of the target word lines.

2. The nonvolatile memory device according to claim 1, wherein the read circuit comprises a precharge circuit which is configured to precharge the bit line each time the read voltage is applied to each of the target word lines.

3. The nonvolatile memory device according to claim 1, wherein the target memory cells change a voltage of the bit line by being turned on or off based on the read voltage sequentially applied to the target word lines, and
wherein the read circuit obtains the first sensing values by sensing the voltage of the bit line.

4. The nonvolatile memory device according to claim 1, wherein the decoder applies a pass voltage of a level higher than the first level simultaneously to word lines to which the read voltage is not applied, while the read voltage is applied to each of the target word lines.

5. The nonvolatile memory device according to claim 1, wherein the multi-read command includes addresses of the target word lines.

6. The nonvolatile memory device according to claim 1, wherein the decoder sequentially applies a read voltage of a second level to the target word lines after applying the read voltage of the first level, based on the multi-read command, and
wherein the read circuit obtains second sensing values of the target memory cells, by sensing the bit line each time the read voltage of the second level is applied to each of the target word lines, and stores the second sensing values in a storage circuit.

7. The nonvolatile memory device according to claim 6, further comprising:
a data output circuit configured to determine a read data bit of each of the target memory cells based on at least one sensing value of each of the target memory cells, and output read data bits of the target memory cells to outside the nonvolatile memory device.

8. The nonvolatile memory device according to claim 1, further comprising:
a control circuit configured to set the first level of the read voltage in response to the multi-read command, and supply the read voltage to the decoder,
wherein the control circuit maintains setting of the first level while the decoder sequentially applies the read voltage to the target word lines.

9. A memory system comprising:
a nonvolatile memory device; and
a controller configured to transmit a multi-read command to the nonvolatile memory device,
the nonvolatile memory device comprising
a plurality of memory cells coupled to a single bit line, wherein each of the plurality of memory cells is coupled to a different word line from a plurality of word lines;
a decoder configured to apply a read voltage of a first level y sequentially selecting target word lines among the word lines, based on the multi-read command to read-access to the plurality of target word lines; and
a read circuit configured to obtain first sensing values of target memory cells coupled to the target word lines, by sensing the bit line each time the read voltage of the first level is applied to each of the target word lines.

10. The memory system according to claim 9, wherein the controller transmits the multi-read command after receiving a sequential read request from a host device.

11. The memory system according to claim 10, wherein the target word lines are successive with one another in a memory block.

12. The memory system according to claim 9, wherein the read circuit comprises a precharge circuit which is configured to precharge the bit line each time the read voltage is applied to each of the target word lines.

13. The memory system according to claim 9,
wherein the target memory cells change a voltage of the bit line by being turned on or off based on the read voltage sequentially applied to the target word lines, and
wherein the read circuit obtains the first sensing values by sensing the voltage of the bit line.

14. The memory system according to claim 9, wherein the decoder applies a pass voltage of a level higher than the first level simultaneously to word lines to which the read voltage is not applied, while the read voltage is applied to each of the target word lines.

15. The memory system according to claim 9,
wherein the decoder sequentially applies a read voltage of a second level to the target word lines after applying the read voltage of the first level, based on the multi-read command, and
wherein the read circuit obtains second sensing values of the target memory cells, by sensing the bit line each time the read voltage of the second level is applied to each of the target word lines, and stores the second sensing values in a storage circuit.

16. The memory system according to claim 15, further comprising:
a data output circuit configured to determine a read data bit of each of the target memory cells based on at least one sensing value of each of the target memory cells, and output read data bits of the target memory cells to a controller.

17. A nonvolatile memory device comprising:
a memory cell array including memory cells coupled to a plurality of word lines and a plurality of bit lines;
a decoder configured to, in order to perform read accesses to target pages based on a multi-read command to read-access to the plurality of target word lines, apply a read voltage of a first level by sequentially selecting target word lines corresponding to the target pages among the word lines; and
a read circuit configured to obtain first sensing values of the respective target pages, by sensing the bit lines each time the read voltage of the first level is applied to each of the target word lines.

18. The nonvolatile memory device according to claim 17, wherein the decoder applies a pass voltage of a level higher than the first level simultaneously to word lines to which the read voltage is not applied, while the read voltage is applied to each of the target word lines.

19. The nonvolatile memory device according to claim 17,
wherein the decoder sequentially applies a read voltage of a second level to the target word lines after applying the read voltage of the first level, based on the multi-read command, and
wherein the read circuit obtains second sensing values of the respective target pages, by sensing the bit lines each time the read voltage of the second level is applied to each of the target word lines, and stores the second sensing values in a storage circuit.

20. The nonvolatile memory device according to claim 19, further comprising:
a data output circuit configured to determine read data of each of the target pages based on sensing values of each of the target pages, and output read data of the target pages to outside the nonvolatile memory device.

* * * * *